(12) United States Patent
Sayed et al.

(10) Patent No.: US 10,497,416 B2
(45) Date of Patent: Dec. 3, 2019

(54) SINGLE NANOMAGNET MEMORY DEVICE FOR MAGNETIC RANDOM ACCESS MEMORY APPLICATIONS

(71) Applicant: Purdue Research Foundation, West Lafayette, IN (US)

(72) Inventors: Shehrin Sayed, Lafayette, IN (US); Supriyo Datta, West Lafayette, IN (US); Esteban E. Marinero-Caceres, West Lafayette, IN (US)

(73) Assignee: Purdue Research Foundation, West Lafayette, IN (US)

(*) Notice: Subject to any disclaimer, the term of this patent is extended or adjusted under 35 U.S.C. 154(b) by 0 days.

(21) Appl. No.: 15/896,036

(22) Filed: Feb. 13, 2018

(65) Prior Publication Data

US 2018/0233188 A1    Aug. 16, 2018

Related U.S. Application Data

(60) Provisional application No. 62/458,540, filed on Feb. 13, 2017.

(51) Int. Cl.
| | |
|---|---|
| *G11C 11/16* | (2006.01) |
| *H01L 27/22* | (2006.01) |
| *H01F 1/03* | (2006.01) |
| *H01L 43/02* | (2006.01) |
| *B82Y 25/00* | (2011.01) |

(52) U.S. Cl.
CPC .......... *G11C 11/161* (2013.01); *H01F 1/0311* (2013.01); *H01L 27/222* (2013.01); *H01L 43/02* (2013.01); *B82Y 25/00* (2013.01)

(58) Field of Classification Search
CPC .................................................... G11C 11/161
See application file for complete search history.

(56) References Cited

U.S. PATENT DOCUMENTS

2016/0169986 A1* 6/2016 Li ..................... G01R 33/096
324/228

OTHER PUBLICATIONS

Sayed, Shehrin, et al. "Proposal of a Single Nano-Magnet Memory Device." IEEE Electron Device Letters, vol. 38, No. 12, 2017, pp. 1665-1668.*
Qin, Xiaowan, et al. "Proposal for Novel Magnetic Memory Device with Spin Momentum Locking Materials." 2017 IEEE/ACM International Symposium on Nanoscale Architectures (NANOARCH), 2017, pp. 45-46.*
Kawahara, T., et al, Spin-transfer torque RAM technology: Review and prospect., Microelectronics Reliability, 52, 2012, pp. 613-627.

(Continued)

*Primary Examiner* — Amir Zarabian
*Assistant Examiner* — Jay W. Radke
(74) *Attorney, Agent, or Firm* — Purdue Research Foundation

(57) ABSTRACT

A spintronic memory device having a spin momentum-locking (SML) channel, a nanomagnet structure (NMS) disposed on the SML, and a plurality of normal metal electrodes disposed on the SML. The magnetization orientation of the NMS is controlled by current injection into the SML through normal metal electrode. The magnetization orientation of the NMS is determined by measuring voltages across the NMS and the SML while flowing charge current through the SML via the normal metal electrodes.

8 Claims, 2 Drawing Sheets

(56) References Cited

OTHER PUBLICATIONS

Wang, J., et al, "Spin transfer torque random access memory", in Emerging Nanoelectronic Devices (John Wiley & Sons Ltd, 2014), pp. 56-77.
Wang, S., et al, "Comparative Evaluation of Spin-Transfer-Torque and Magnetoelectric Random Access Memory", IEEE Journal on Emerging and Selected Topics in Circuits and Systems 6, 2016, pp. 134-145.
Ando, K., et al, "Spin-transfer torque magnetoresistive random-access memory technologies for normally off computing (invited)", Journal of Applied Physics 115, 2014, pp. 172607-1-172607-6.
Apalkov, D., et al, "Magnetoresistive Random Access Memory", Proceedings of the IEEE 104, 2016, pp. 1796-1830.
Zhu, J.G., et al, "Magnetic tunnel junctions" Materials Today, 9, 36, 2006, pp. 36-45.
Gallagher, W. J., et al, "Development of the magnetic tunnel junction MRAM at IBM: From first junctions to a 16-Mb MRAM demonstrator chip", IBM Journal of Research and Development 50, 5, 2006, pp. 5-23.
Mazaletskiy, L.A., et al, "Problems of the experimental implementation of MTJ", Journal of Physics: Conference Series, 643, 012105, 2015, pp. 5.
Oliver, B., et al, "Two breakdown mechanisms in ultrathin alumina barrier magnetic tunnel junctions" Journal of Applied Physics, 95, 2004, pp. 1315-1322.
Isogami, S., et al, "In situ heat treatment of ultrathin MgO layer for giant magnetoresistance ratio with low resistance area product in CoFeB/MgO/CoFeB magnetic tunnel junctions", Applied Physics Letters 93, 192109, 2008, pp. 4.
Zhao, W., et al, "Failure Analysis in Magnetic Tunnel Junction Nanopillar with Interfacial Perpendicular Magnetic Anisotropy", Materials, 9, 41, 2016, pp. 17.
Hong, S., et al, "Modeling potentiometric measurements in topological insulators including parallel channels, Phys. Rev. Modeling potentiometric measurements in topological insulators including parallel channels", B, 86, 085131, 2012, pp. 085131-1-085131-5.
Sayed, S., et al, "Multi-Terminal Spin Valve on Channels with Spin-Momentum Locking", Sci. Rep. 6, 35658, 2016, pp. 9.
Hasan, M., "Colloquium: Topological insulators", Rev. Mod. Phys. 82, 2010, pp. 3045-3067.
Qi, Z., et al, "Topological insulators and superconductors", Rev. Mod. Phys. 83, 2011, pp. 1057-1110.
Ando, Y., et al, "Topological Insulator Materials", Phys. Soc. Jpn. 82, 2013, pp. 102001-1-102001-32.
Hammer, P.R., et al, "Potentiometric measurements of the spin-split subbands in a two-dimensional electron gas", Phys. Rev. B 61, 2000, pp. 7207-7210.
Park, Y., et al, "Observation of gate-controlled spin-orbit interaction using a ferromagnetic detector", Journal of Applied Physics, 111, 07, 2012, pp. 4.
Sanchez, J., et al, "Spin-to-charge conversion using Rashba coupling at the interface between non-magnetic materials", Nat. Commun. 4, 2944, 2016, pp. 1-7.

Miron, I., et al, "Perpendicular switching of a single ferromagnetic layer induced by in-plane current injection", Nature 476, 2011, pp. 189-194.
Suzuki, T., et al, "Current-induced effective field in perpendicularly magnetized Ta/CoFeB/MgO wire", Appl. Phys. Lett. 98, 2011, pp. 142505-1-142505-3.
Pai, C., et al., "Spin transfer torque devices utilizing the giant spin Hall effect of tungsten", Appl. Phys. Lett. 101, 2012, pp. 122404-01-122404-4.
Yan, B., et al, "Topological states on the gold surface", Nat. Commun. 6, 2015, pp. 1-6.
Fan Y., Magnetization switching through giant spin—orbit torque in a magnetically doped topological insulator heterostructure, Nat. Materials 13, 2014, pp. 699-704.
Liu, L., et al, "Spin-Torque Switching with the Giant Spin Hall Effect of Tantalum", Science 336, 2012, pp. 555-558.
Liu, L., et al, "Current-Induced Switching of Perpendicularly Magnetized Magnetic Layers Using Spin Torque from the Spin Hall Effect", Phys. Rev. Lett. 109, 2012, pp. 096602-01-096602-05.
Buhrman, R., et al, "Spin hall e ect magnetic apparatus, method and applications", U.S. Pat. No. 9,105,832, 2015, pp. 32.
Jabeur, K., et al, Study of Two Writing Schemes for a Magnetic Tunnel Junction Based on Spin Orbit Torque International Journal of Electrical, Computer, Energetic, Electronic and Communication Engineering 7, 2013, pp. 1054-1059.
Bishnoi, R., et al, "Architectural Aspects in Design and Analysis of SOT-based Memories, in 2014 19th Asia and South Pacic Design Automation", Conference (ASP-DAC), 2014, pp. 700-707.
Li, C., et al, "Electrical detection of charge-current-induced spin polarization due to spin-momentum locking in Bi2Se3", Nat. Nanotechnol. 9, 2014, pp. 218-224.
Dankert, A., et al, "Room Temperature Electrical Detection of Spin Polarized Currents in Topological Insulators", Nano Letters 15, 2015, pp. 7976-7981.
Pham, V. T., et al., "Ferromagnetic/Nonmagnetic Nanostructures for the Electrical Measurement of the Spin Hall Effect", Nano Letters 16, 2016, pp. 6755-6760.
Pham, V. T., et al., "Electrical detection of magnetic domain walls by inverse and direct spin Hall effect", Appl. Phys. Lett. 109, 2016, pp. 192401-01-192401-04.
Data, S., "Electronic Transport in Mesoscopic Systems", Cambridge University Press, Cambridge, 1997, pp. 393.
Hong, S., et al, "Spin Circuit Model for 2D Channels with Spin-Orbit Coupling", Sci. Rep. 6, 2016, pp. 1-11.
Sun, Z., "Spin-current interaction with a monodomain magnetic body: A model study". Phys. Rev. B 62, 2000, pp. 570-578.
Zeng, Z., et al, "Effect of resistance-area product on spintransfer switching in MgO-based magnetic tunnel junction memory cells", Appl. Phys. Lett. 98, 2011, pp. 072512-1-072512-3.
Kim, J., et al., "A Technology-Agnostic MTJ SPICE Model with User-Defined Dimensions for STT-MRAM Scalability Studies", in 2015 IEEE Custom Integrated Circuits Conference (CICO), 2015, pp. 4.

* cited by examiner

SINGLE NANOMAGNET MEMORY DEVICE FOR MAGNETIC RANDOM ACCESS MEMORY APPLICATIONS

CROSS-REFERENCE TO RELATED APPLICATIONS

The present U.S. patent application relates to and claims the priority benefit of U.S. Provisional Patent Application Ser. No. 62/458,540, filed Feb. 13, 2017, the contents of which are hereby incorporated by reference in their entirety.

TECHNICAL FIELD

The present application relates to electronic memory devices, and more specifically, magnetic random access memory devices.

BACKGROUND

Scaling of semiconductor based memory technologies such as SRAM, DRAM, Flash etc. is near its fundamental limit and magnetic random access memory (MRAM) is one technology which has been considered a potential candidate for replacement, as MRAM offers virtually unlimited endurance and lower write time. Various MRAM architectures use a magnetic tunnel junction (MTJ) as the memory element and rely on high tunneling magnetoresistance (TMR) for reading operation. Fabrication of high quality MTJs depends on the quality of the tunneling barrier, as its thickness determines the life time and TMR. Pinholes and other defects during the formation of the dielectric layer degrades the TMR and breakdown tolerance. Moreover, MTJs, when integrated with standard back-end-of-line (BEOL) CMOS processing, may be subject to over-annealing as the optimum annealing temperature of MTJ is much lower than the standard CMOS BEOL temperature. Over-annealing causes various issues such as creation of a dead layer, lattice mismatch between the magnetic and the oxide layer etc. The large variation of TMR and reliability issues induced by such process variation creates challenges in realizing high bit density MRAM arrays. Thus, improvements are needed in the field. The NMS may be either a single ferromagnetic layer or a plurality of magnetically exchange coupled layers whose magnetic interactions are controlled by judicious coupling interlayers in order to provide the desired magnetic properties (magnetization, anisotropy and coercivity) to optimize switching.

SUMMARY

According to one aspect, a spintronic memory device is disclosed, comprising a spin momentum-locking (SML) channel, a nanomagnet structure (NMS) disposed on the SML, and a plurality of normal metal electrodes disposed on the SML, wherein the magnetization orientation of the NMS is controlled by current injection into the SML through normal metal electrodes and said magnetization orientation of the NMS is determined by measuring voltages across the NMS and the SML while flowing charge current through the SML via the normal metal electrodes. The magnetization switching of the NMS may be driven by spin-orbit torque (SOT) interactions resulting from charge current injection into the SML through the normal metal electrodes. A magnetization assistive switching mechanism may also be provided which comprises heat, strain or magneto-electric effects that working together with SOT improve the switching efficiency. The SML channel may be fabricated from materials with high spin-orbit coupling. For example, the SML channel material may comprise heavy metals (Pt, Ta, W, Au, etc.), topological insulators (Bi2Se3, Bi2Te3, etc.), Rashba two dimensional electron gas semiconductors (InSb, InAs, etc.) or Rashba interfaces such as Ag/Bi, or combinations thereof. The ferromagnetic layers may comprise CoFeB, NiFe, or CoFe, or binary, ternary or quaternary hcp-Co alloys (such as CoPt, CoPtCr, CoPtTaCr, etc). The magnetic interactions in said exchange coupled layers include ferromagnetic, antiferromagnetic or ferrimagnetic interactions. The reading of the magnetic state of the NMS may be based on the spin potential generated in the channel due to a relatively smaller charge current, $i_c$, injected into the SML channel through the normal metal electrodes, and the spin potential may be measured as a charge voltage signal between the NMS and normal metal electrodes. The forward and backward moving states of the SML may be spin polarized up and down respectively generating a spin potential in the channel, with the voltage measured at the NMS measuring either the up or down spin electrochemical potential, $V_{fm}$ ($m_z$), depending on the magnetization orientation $m_z = +1$ or $-1$ of the NMS. The NMS may comprise a single ferromagnetic layer formed from CoFeB, CoFe, Co, Fe, Ni, or Py, wherein the resistance of the NMS (both bulk and interface) is higher than the resistance of the SML layer. In order to enhance the readout signal associated with the spin potential generated in the SML, the NMS resistance may be configured to be higher than that of the SML, wherein the NMS resistance includes both contact resistances and the magnetic layers intrinsic resistivity. The NMS may comprise a composite or multilayered structure that includes magnetic and dielectric materials. The ratio of the magnetic and dielectric materials may be optimized to provide the nanomagnet resistivity for optimum signal detection. The magnetic materials used as the storage nanomagnet (NMS) may include but are not limited to: disordered binary alloys of Co—Pt, Co—Fe, or Ni—Fe, ternary disordered alloys of Co—Fe—Pt, Co—Pt—Ta, or Co—Ni—Fe; ordered CoPt or FePt alloys, ferrimagnets of the rare-earth transition metals, TbFe, GdCo; the dielectric material includes metallic oxides of Ta, Ti, W, Zr, Al, or V as well as the nitride counterparts. A magnetic oxide, such as bismuth-substituted garnet, ferrite or tantanate, may be used to form the nanomagnet. The signal-to-noise-ratio (SNR) of the readout signal may be enhanced through differential detection utilizing a comparator device into which the voltage from the NMS ($V_{fm}$) together with a reference voltage ($V_{ref}$) are fed, wherein the output voltage of the comparator changes signs depending on the magnetization direction of the NMS. The reference voltage ($V_{ref}$) may be generated with an additional on-cell potentiometric normal metal contact (PNM) that is disposed at the same distance as the NMS from the current injection electrode. A plurality of the above devices may be connected for information storage, wherein data integrity and tamper-protection for each hardware memory element is provided through the generation of unclonable physical functions by determining the readout characteristics of each element using localized reference voltage measurements. Global signal referencing for the array elements may be provided using a separate unit cell with only PNM or through separate circuitry for an array of memory devices.

BRIEF DESCRIPTION OF THE DRAWINGS

In the following description and drawings, identical reference numerals have been used, where possible, to designate identical features that are common to the drawings.

The attached drawings are for purposes of illustration and are not necessarily to scale.

DETAILED DESCRIPTION

Throughout this description, some aspects are described in terms that would ordinarily be implemented as software programs. Those skilled in the art will readily recognize that the equivalent of such software can also be constructed in hardware, firmware, or micro-code. Because data-manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

The present disclosure provides a simplified spintronics memory device comprising a single free-layer nanomagnet structure wherein the magnetic orientation of the nanomagnet is controlled and sensed by charge currents flowing through a channel with spin momentum locking (SML) upon which the namomagnet is fabricated. The invention circumvents the limitations of current state-of-the-art magnetic tunnel junctions (MTJ) in which in addition to the free-layer (FL) nanomagnet, a reference layer (RL) nanomagnet structure and a tunnel barrier layer (TB), disposed between the FL and the RL are utilized. The FL magnetization in an MTJ is switched through spin transfer torque interactions with spin currents injected through the RL into the FL via the TB. This requires large charge current densities flowing through the MTJ stack that often exceed the breakdown voltage of the TB. The magnetic state of the FL is read by flowing a small non-switching current that measures the two terminal resistance across the MTJ stack for parallel and anti-parallel aligned FL/RL magnetization orientations. The TB needs to be defect and pin-hole free and its thickness should preferably be <1 nm for TMR optimization. This imposes stringent fabrication requirements for the TB and in general for MTJ devices. Said requirements and tolerances are exacerbated as the MTJ's footprint is reduced to increment memory storage density.

Figure 1A:
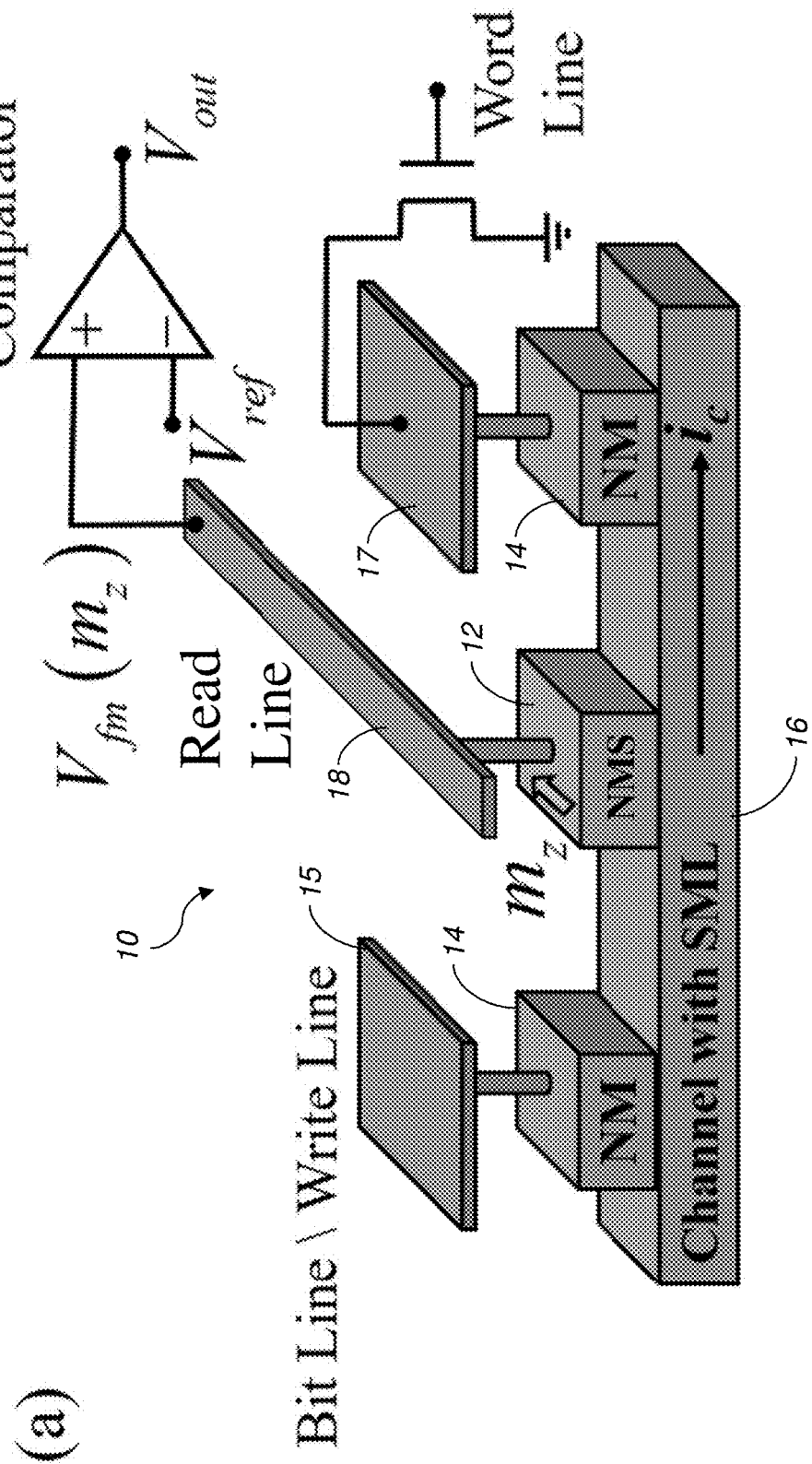
FIG. 1a is a diagram showing a magnetic random access memory device according to one embodiment.

FIG. 1a shows a memory cell 10 according to one embodiment of the present disclosure. As shown, a nanomagnet 12 (orange) and two normal metal contacts 14 (green) are fabricated on top of a channel material (blue) 16 exhibiting spin-momentum locking. The magnetization orientation, $m_z$, is altered by injecting large current densities (e.g., $10^6 \sim 10^7$ A/cm$^2$) into the channel 16. The magnetization state of the nanomagnet 12 is read through voltage measurements of the spin potential in the channel induced by a charge current of lower magnitude.

The nanomagnet 12 depicted in the FIG. 1a is not limited to a single ferromagnetic layer, but may comprise a synthetic ferrimagnet, an exchange coupled hard/soft spring magnet structure or a composite architecture comprising magnetic and non-magnetic materials. The nanomagnet magnetic anisotropy includes in-plane magnetization as depicted in FIG. 1a, as well as magnets with perpendicular magnetic anisotropy (PMA). The spin momentum locking channel may be fabricated from materials with high spin-orbit coupling such as heavy metals (Pt, Ta, W, Au, etc), topological insulators (Bi2Se3, Bi2Te3, etc), Rashba two dimensional electron gas in semiconductors (InSb, InAs, etc) or Rashba interfaces such as Ag/Bi. Magnetic switching in the devices of the present disclosure does not require charge current flow through the nanomagnet. Spin polarized currents are generated at the interface between the channel and the nanomagnet when charge current is injected into the channel through the normal metal contacts depicted in the FIGURE. When the current in the channel is sufficiently large (write current), the magnetization direction is switched through spin-orbit-torque interactions. Reversing the current direction enables switching the magnetization in the opposite direction. In the case where the channel material is a heavy metal, the write current yields low power dissipation in contrast to spin-transfer torque MTJ switching in which the charge current is flown through the insulating TB. As indicated in FIG. 1a, one of the NM contacts 15 is connected to a Bit Line/Write Line of a memory system whereas the other NM contact 17 is connected to the drain of a MOSFET while the source of the MOSFET is grounded. The MOSFET gate is connected to the Word Line of the memory system which turns the MOSFET on and off. A voltage applied to the bit/write line causes a charge current, $i_c$ as shown, only when the MOSFET is turned on by the word line. It shall be understood that the MOSFET shown in FIG. 1a may comprise other power switching devices, including but not limited to BJT, MEMS switches, capacitors, and the like.

The reading of the magnetic state of the nanomagnet 12 exploits the spin potential generated in the channel due to a charge current, $i_c$, injected into the channel, which is measured with the nanomagnet 12. Charge current in any arbitrary channel causes a separation between electrochemical potentials for forward and backward moving states, while in spin momentum locking channels, the forward and backward moving states are spin polarized up and down respectively generating a spin potential in the channel. The nanomagnet 12 measures either the up or down spin electrochemical potential on the nanomagnet 12, $V_{fm}$ ($m_z$), depending on the magnetization orientation $m_z$=+1 or −1 of the nanomagnet, thereby allowing readout of the information stored in the device. As indicated in FIG. 1a, $V_{fm}$ is fed into a capacitor via read line 18 together with a reference voltage $V_{ref}$ (measured with a normal metal contact on the same or similar channel) The output voltage of the comparator is positive when $V_{fm} > V_{ref}$ or negative when $V_{fm} < V_{ref}$.

The nanomagnet contact 12 of the present disclosure may comprise a thin ferromagnetic layer that includes but is not limited to CoFeB, CoFe, NiFe, Co, Fe, Ni, etc. The voltage measured at the nanomagnet, $V_{fm}$ ($m_z$), depends on the resistance of the nanomagnet contact relative to the channel resistance. The nanomagnet resistance includes both contact resistances and the nanomagnet intrinsic resistivity. The nanomagnet resistance is preferably higher than that of the channel. Therefore the microstructure of the nanomagnet contacts used as a storage element may be engineered to provide the optimum resistivity. In certain embodiments, nanomagnets comprising composite and multilayered structures that incorporate magnetic and dielectric materials are used. The ratio of the ferromagnetic and dielectric components may be optimized to engineer the nanomagnet resistivity for optimum signal detection. Examples of magnetic materials that can be used to implement the teachings of the present disclosure include but are not limited to: disordered binary alloys of Co—Pt, Co—Fe, Ni—Fe, ternary disordered alloys of Co—Fe—Pt, Co—Pt—Ta, Co—Ni—Fe, etc; ordered CoPt and FePt alloys, ferrimagnets of the rare-earth transition metals, TbFe, GdCo, etc; the dielectric component includes metallic oxides of Ta, Ti, W, Zr, Al, V, etc as well as the nitride counterparts. In addition, magnetic oxides such as bismuth-substituted garnets, ferrites and tantanates as materials may be used for the nanomagnet of the present disclosure.

Figure 1B:
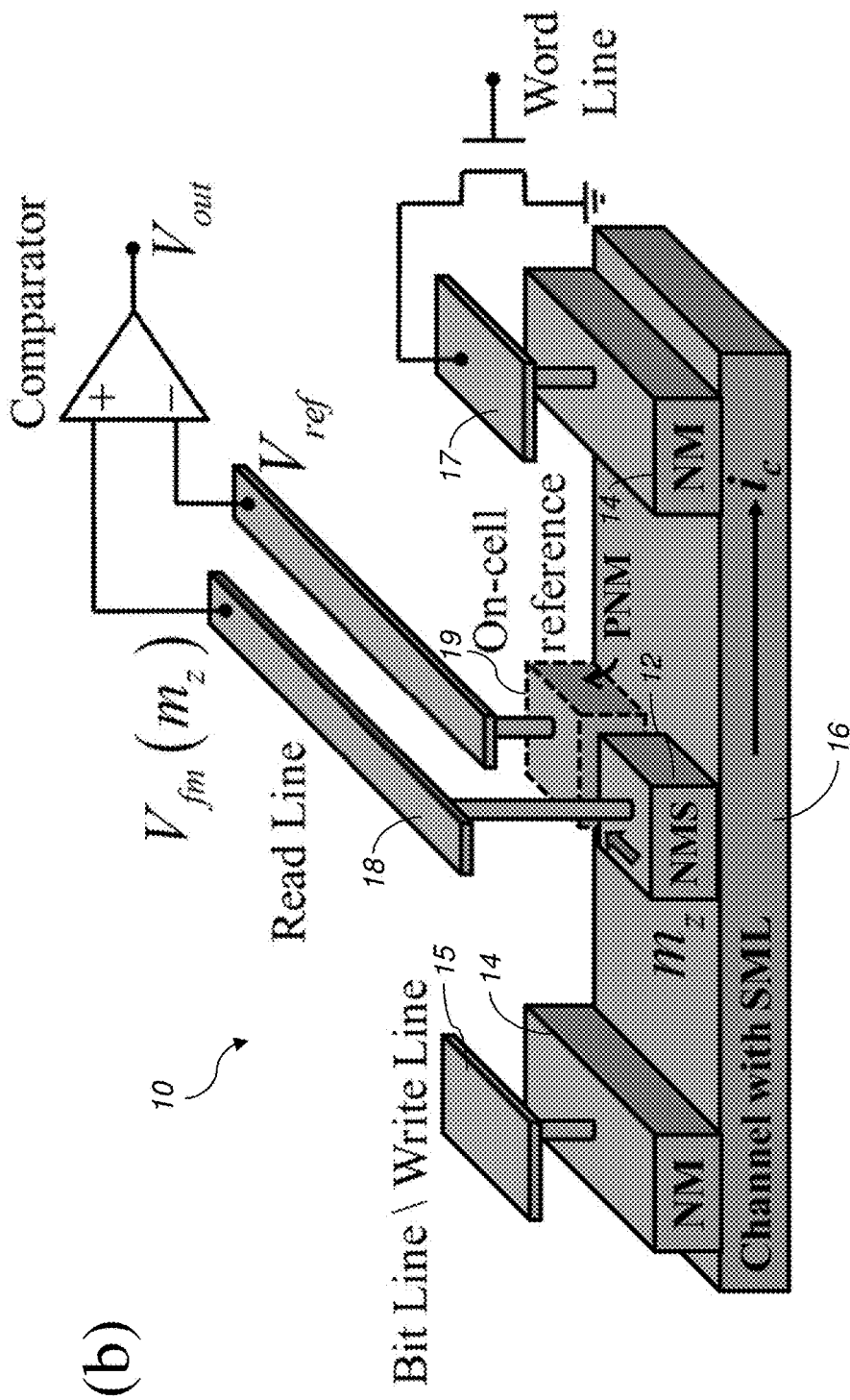
FIG. 1b is a diagram showing a magnetic random access memory according to one embodiment wherein the reference voltage ($V_{ref}$) is generated with an additional on-cell potentiometric normal metal contact (NME3) that is disposed at the same distance as the NMS from the current injection electrode.

FIG. 1b shows a further embodiment wherein the reference voltage ($V_{ref}$) is generated with an additional on-cell potentiometric normal metal contact 19 that is disposed at the same distance as the nanomagnet from the current injector normal metal contact 14. The potentiometric normal metal contact 14 comprises a material whose resistance is higher than the SML channel in order to avoid current shunting by the contact. The current shunting in normal metal contact 14 can be avoided by a thin oxide layer between the contact and channel as well.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless otherwise explicitly noted. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected within the spirit and scope of the invention.

The invention claimed is:

1. A spintronic memory device, comprising:
a spin momentum-locking (SML) channel;
a nanomagnet structure (NMS) disposed on the SML; and
a plurality of normal metal electrodes disposed on the SML, wherein magnetization orientation of the NMS is controlled by current injection into the SML through the normal metal electrodes and said magnetization orientation of the NMS is determined by measuring voltages across the NMS and the SML while flowing charge current through the SML via the normal metal electrodes;
wherein magnetization switching of the NMS is driven by spin-orbit torque (SOT) interactions resulting from charge current injection into the SML through the normal metal electrodes;
wherein the NMS is a single ferromagnetic layer.

2. The device according to claim 1, wherein a magnetic oxide is used to form the nanomagnet structure.

3. The device according to claim 2, wherein the magnetic oxide comprises bismuth-substituted garnet, ferrite or tantanate.

4. A spintronic memory device, comprising:
a spin momentum-locking (SML) channel;
a nanomagnet structure (NMS) disposed on the SML; and
a plurality of normal metal electrodes disposed on the SML, wherein magnetization orientation of the NMS is controlled by current injection into the SML through the normal metal electrodes and said magnetization orientation of the NMS is determined by measuring voltages across the NMS and the SML while flowing charge current through the SML via the normal metal electrodes;
wherein magnetization switching of the NMS is driven by spin-orbit torque (SOT) interactions resulting from charge current injection into the SML through the normal metal electrodes;
wherein the NMS is a plurality of magnetically exchange coupled layers whose magnetic interactions are controlled by coupling interlayers in order to provide desired magnetic properties to optimize switching.

5. The device according to claim 4, wherein magnetic interactions in said exchange coupled layers include ferromagnetic, antiferromagnetic or ferrimagnetic interactions.

6. A spintronic memory device, comprising:
a spin momentum-locking (SML) channel;
a nanomagnet structure (NMS) disposed on the SML; and
a plurality of normal metal electrodes disposed on the SML, wherein magnetization orientation of the NMS is controlled by current injection into the SML through the normal metal electrodes and said magnetization orientation of the NMS is determined by measuring voltages across the NMS and the SML while flowing charge current through the SML via the normal metal electrodes;
wherein a signal-to-noise-ratio (SNR) of the readout signal is enhanced through differential detection utilizing a comparator device into which the voltage from the NMS ($V_{fm}$) together with a reference voltage ($V_{ref}$) are fed, wherein an output voltage of the comparator changes signs depending on the magnetization direction of the NMS.

7. The device according to claim 6, wherein the reference voltage ($V_{ref}$) is generated with an additional on-cell potentiometric normal metal contact (PNM) that is disposed on the SML at the same distance as the NMS from the current injection electrode.

8. A spintronic memory device, comprising:
a) a spin momentum-locking (SML) channel;
b) a nanomagnet structure (NMS) disposed on the SML; and
c) a plurality of normal metal electrodes disposed on the SML, wherein magnetization orientation of the NMS is controlled by current injection into the SML through the normal metal electrodes and said magnetization orientation of the NMS is determined by measuring voltages across the NMS and the SML while flowing charge current through the SML via the normal metal electrodes;
wherein a plurality of said devices are connected for information storage, wherein data integrity and tamper-protection for each hardware memory element is provided through the generation of unclonable physical functions by determining readout characteristics of each element using localized reference voltage measurements.

* * * * *